(12) United States Patent
Lee et al.

(10) Patent No.: US 8,937,352 B2
(45) Date of Patent: Jan. 20, 2015

(54) HIGH VOLTAGE METAL-OXIDE-SEMICONDUCTOR TRANSISTOR DEVICE AND LAYOUT PATTERN THEREOF

(71) Applicant: United Microelectronics Corp., Hsin-Chu (TW)

(72) Inventors: Ming-Tsung Lee, Yilan County (TW); Cheng-Hua Yang, Hsinchu (TW); Wen-Fang Lee, Hsinchu (TW); Chih-Chung Wang, Hsinchu (TW); Chih-Wei Hsu, New Taipei (TW); Po-Ching Chuang, Taoyuan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/181,733

(22) Filed: Feb. 17, 2014

(65) Prior Publication Data

US 2014/0159155 A1 Jun. 12, 2014

Related U.S. Application Data

(63) Continuation of application No. 13/407,722, filed on Feb. 28, 2012, now Pat. No. 8,692,326.

(51) Int. Cl.
*H01L 29/78* (2006.01)
*H01L 29/06* (2006.01)
*H01L 29/40* (2006.01)
*H01L 29/423* (2006.01)

(52) U.S. Cl.
CPC ........ *H01L 29/7816* (2013.01); *H01L 29/0634* (2013.01); *H01L 29/0696* (2013.01); *H01L 29/402* (2013.01); *H01L 29/404* (2013.01); *H01L 29/42368* (2013.01)
USPC ........................................... 257/343; 257/487

(58) Field of Classification Search
USPC ........................................ 257/343, 335, 487
See application file for complete search history.

(56) References Cited

U.S. PATENT DOCUMENTS

| | | | |
|---|---|---|---|
| 4,344,081 | A | 8/1982 | Pao |
| 4,396,999 | A | 8/1983 | Malaviya |
| 4,893,160 | A | 1/1990 | Blanchard |
| 4,918,333 | A | 4/1990 | Anderson |
| 4,958,089 | A | 9/1990 | Fitzpatrick |
| 5,040,045 | A | 8/1991 | McArthur |
| 5,268,589 | A | 12/1993 | Dathe |
| 5,296,393 | A | 3/1994 | Smayling |
| 5,326,711 | A | 7/1994 | Malhi |

(Continued)

OTHER PUBLICATIONS

Wang, Title of Invention: High Voltage Metal-Oxide-Semiconductor Transistor Device and Method of Fabricating the Same, U.S. Appl. No. 13/216,276, filed Aug. 24, 2011.

*Primary Examiner* — Roy Potter
(74) *Attorney, Agent, or Firm* — Winston Hsu; Scott Margo

(57) ABSTRACT

A layout pattern of an implant layer includes at least a linear region and at least a non-linear region. The linear region includes a plurality of first patterns to accommodate first dopants and the non-linear region includes a plurality of second patterns to accommodate the first dopants. The linear region abuts the non-linear region. Furthermore, a pattern density of the first patterns in the linear region is smaller than a pattern density of the second patterns in the non-linear region.

9 Claims, 5 Drawing Sheets

(56) References Cited

U.S. PATENT DOCUMENTS

| | | | |
|---|---|---|---|
| 5,346,835 A | 9/1994 | Malhi | |
| 5,430,316 A | 7/1995 | Contiero | |
| 5,436,486 A | 7/1995 | Fujishima | |
| 5,534,721 A | 7/1996 | Shibib | |
| 5,811,850 A | 9/1998 | Smayling | |
| 5,950,090 A | 9/1999 | Chen | |
| 5,998,301 A | 12/1999 | Pham | |
| 6,066,884 A | 5/2000 | Krutsick | |
| 6,144,538 A | 11/2000 | Chao | |
| 6,165,846 A | 12/2000 | Carns | |
| 6,245,689 B1 | 6/2001 | Hao | |
| 6,277,675 B1 | 8/2001 | Tung | |
| 6,277,757 B1 | 8/2001 | Lin | |
| 6,297,108 B1 | 10/2001 | Chu | |
| 6,306,700 B1 | 10/2001 | Yang | |
| 6,326,283 B1 | 12/2001 | Liang | |
| 6,353,247 B1 | 3/2002 | Pan | |
| 6,388,292 B1 | 5/2002 | Lin | |
| 6,400,003 B1 | 6/2002 | Huang | |
| 6,424,005 B1 | 7/2002 | Tsai | |
| 6,492,691 B2 * | 12/2002 | Magri' et al. | 257/401 |
| 6,514,830 B1 | 2/2003 | Fang | |
| 6,521,538 B2 | 2/2003 | Soga | |
| 6,614,089 B2 | 9/2003 | Nakamura | |
| 6,713,794 B2 | 3/2004 | Suzuki | |
| 6,762,098 B2 | 7/2004 | Hshieh | |
| 6,764,890 B1 | 7/2004 | Xu | |
| 6,784,060 B2 | 8/2004 | Ryoo | |
| 6,784,490 B1 | 8/2004 | Inoue | |
| 6,819,184 B2 | 11/2004 | Pengelly | |
| 6,822,296 B2 | 11/2004 | Wang | |
| 6,825,531 B1 | 11/2004 | Mallikarjunaswamy | |
| 6,846,729 B2 | 1/2005 | Andoh | |
| 6,855,581 B2 | 2/2005 | Roh | |
| 6,869,848 B2 | 3/2005 | Kwak | |
| 6,894,349 B2 | 5/2005 | Beasom | |
| 6,958,515 B2 | 10/2005 | Hower | |
| 7,015,116 B1 | 3/2006 | Lo | |
| 7,023,050 B2 | 4/2006 | Salama | |
| 7,037,788 B2 | 5/2006 | Ito | |
| 7,075,575 B2 | 7/2006 | Hynecek | |
| 7,091,079 B2 | 8/2006 | Chen | |
| 7,148,540 B2 | 12/2006 | Shibib | |
| 7,214,591 B2 | 5/2007 | Hsu | |
| 7,309,636 B2 | 12/2007 | Chen | |
| 7,323,740 B2 | 1/2008 | Park | |
| 7,358,567 B2 | 4/2008 | Hsu | |
| 7,427,552 B2 | 9/2008 | Jin | |
| 8,507,988 B2 | 8/2013 | Yao | |
| 2003/0022460 A1 | 1/2003 | Park | |
| 2004/0018698 A1 | 1/2004 | Schmidt | |
| 2004/0070050 A1 | 4/2004 | Chi | |
| 2005/0227448 A1 | 10/2005 | Chen | |
| 2005/0258496 A1 | 11/2005 | Tsuchiko | |
| 2006/0035437 A1 | 2/2006 | Mitsuhira | |
| 2006/0261407 A1 | 11/2006 | Blanchard | |
| 2006/0270134 A1 | 11/2006 | Lee | |
| 2006/0270171 A1 | 11/2006 | Chen | |
| 2007/0041227 A1 | 2/2007 | Hall | |
| 2007/0082440 A1 | 4/2007 | Shiratake | |
| 2007/0132033 A1 | 6/2007 | Wu | |
| 2007/0273001 A1 | 11/2007 | Chen | |
| 2008/0160697 A1 | 7/2008 | Kao | |
| 2008/0160706 A1 | 7/2008 | Jung | |
| 2008/0185629 A1 | 8/2008 | Nakano | |
| 2008/0296655 A1 | 12/2008 | Lin | |
| 2009/0108348 A1 | 4/2009 | Yang | |
| 2009/0111252 A1 | 4/2009 | Huang | |
| 2009/0159966 A1 | 6/2009 | Huang | |
| 2009/0278208 A1 | 11/2009 | Chang | |
| 2009/0294865 A1 | 12/2009 | Tang | |
| 2010/0006937 A1 | 1/2010 | Lee | |
| 2010/0032758 A1 | 2/2010 | Wang | |
| 2010/0096702 A1 | 4/2010 | Chen | |
| 2010/0148250 A1 | 6/2010 | Lin | |
| 2010/0213517 A1 | 8/2010 | Sonsky | |
| 2011/0057263 A1 | 3/2011 | Tang | |
| 2013/0049114 A1 | 2/2013 | Wang | |

\* cited by examiner

HIGH VOLTAGE METAL-OXIDE-SEMICONDUCTOR TRANSISTOR DEVICE AND LAYOUT PATTERN THEREOF

CROSS REFERENCE TO RELATED APPLICATIONS

This is a continuation application of U.S. patent application Ser. No. 13/407,722, filed on Feb. 28, 2012, and all benefits of such earlier application are hereby claimed for this new continuation application.

BACKGROUND OF THE INVENTION

1. Field of the Invention

The invention relates to a high voltage metal-oxide-semiconductor (hereinafter abbreviated as HV MOS) device and a layout patterned thereof, and more particularly, to a high voltage lateral double-diffused metal-oxide-semiconductor (HV-LDMOS) device and a layout patterned thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dope concentration and large area. The drift region is used to alleviate the high voltage between the drain and the source, therefore LDMOS transistor device can have higher breakdown voltage.

Please refer to FIG. 1, which is a cross-sectional view of a conventional HV-LDMOS transistor device. As shown in FIG. 1, the conventional HV-LDMOS transistor device 10 having a P-type well 20, a source 14 and a P-type heavily doped region 22 formed in the P-type well 20, a gate 16 and a drain 18 is formed on a semiconductor substrate 12. The drain 18 is an N-type heavily doped region formed in an N-type well 30, which is the drift region as mentioned above. The dope concentration and length of the drift region affects the breakdown voltage and the ON-resistance ($R_{ON}$) of the HV-LDMOS transistor device 10. The gate 16 of the HV-LDMOS transistor device 10 is positioned on a gate dielectric layer 40 and extended to cover a portion of a field oxide layer 42.

It is well-known that characteristics of low $R_{ON}$ and high breakdown voltage are always required to the HV MOS transistor device. However, breakdown voltage and $R_{ON}$ are conflicting parameters with a trade-off relationship. Therefore, a HV LDMOS transistor device that is able to realize high breakdown voltage and low $R_{ON}$ is still in need.

SUMMARY OF THE INVENTION

According to the claimed invention, a layout pattern of a HV MOS transistor device is provided. The HV MOS transistor device includes a first doped region having a first conductivity type, a second doped region having the first conductivity type, and a non-continuous doped region positioned in between the first doped region and the second doped region. The non-continuous doped region includes a plurality of gaps formed therein. The non-continuous doped region further includes a second conductivity type complementary to the first conductivity type.

According to the claimed invention, a HV MOS transistor device is provided. The HV MOS transistor includes a substrate having an insulating layer formed thereon, a gate positioned on the substrate and covering a portion of the insulating layer, a drain region positioned in the substrate, a source region positioned in the substrate, and a non-continuous doped region positioned in between the source region and the drain region. The non-continuous doped region includes a plurality of gaps formed therein. The source region and the drain region include a first conductivity type, the non-continuous doped region includes a second conductivity type, and the first conductivity type and the second conductivity type are complementary to each other.

According to the claimed invention, a layout pattern of an implant layer is further provided. The layout pattern includes at least a linear region and at least a non-linear region. The linear region includes a plurality of first patterns to accommodate first dopants and the non-linear region includes a plurality of second patterns to accommodate the first dopants. The linear region abuts the non-linear region. Furthermore, a pattern density of the first patterns in the linear region is smaller than a pattern density of the second patterns in the non-linear region.

According to the HV MOS transistor device and its layout pattern provided by the present invention, the non-continuous doped region is rendered to improve the breakdown voltage of the HV MOS transistor device. Furthermore, since the non-continuous doped region is interrupted by the gaps, the total area of doped portions of the non-continuous doped region is reduced. Consequently, $R_{ON}$ is decreased efficaciously. Briefly speaking, the HV MOS transistor device and the layout pattern thereof provided by the present invention realize the expectation of high breakdown voltage and low $R_{ON}$.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
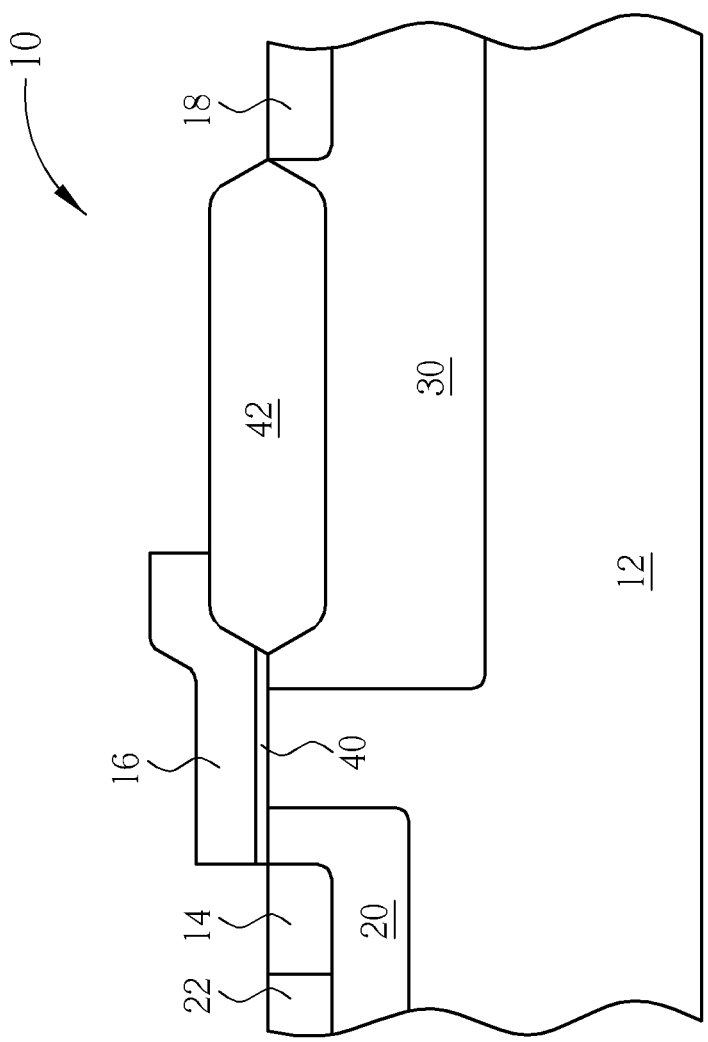
FIG. 1 is a cross-sectional view of a conventional HV-LDMOS transistor device.
Figure 2:
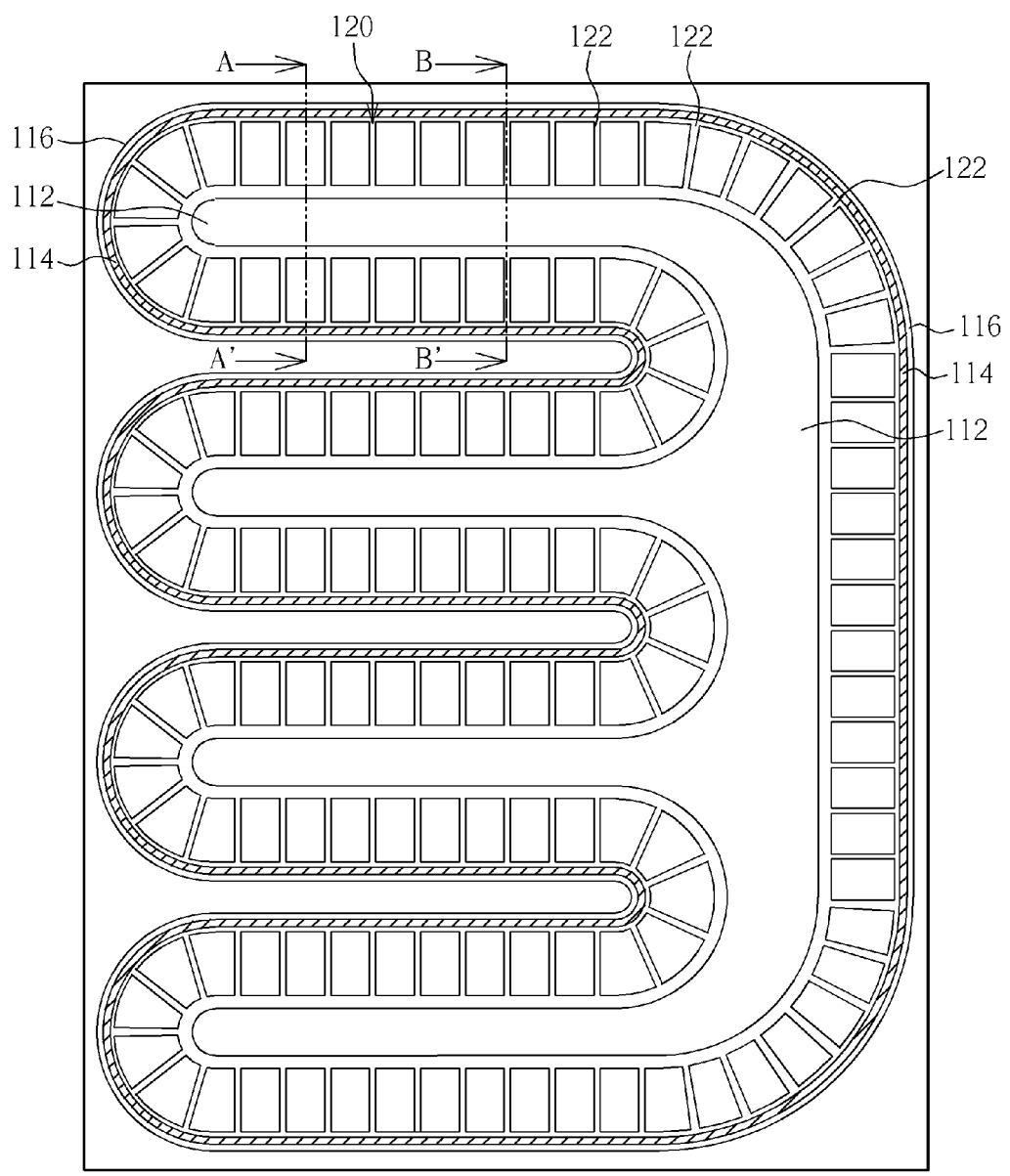
FIGS. 2 and 5-6 is a schematic drawing of a layout pattern of a HV MOS transistor device provided by a preferred embodiment of the present invention.
Figure 3:
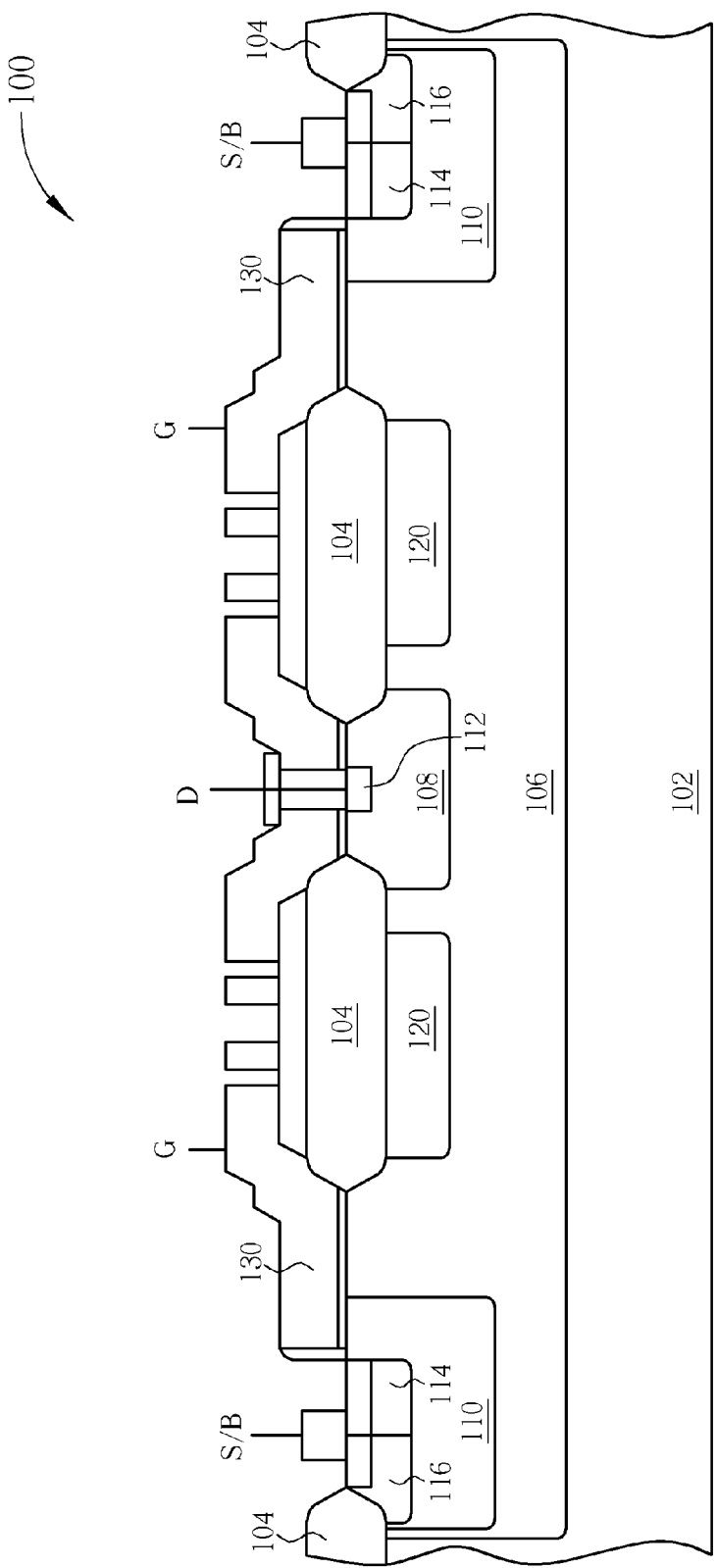
FIGS. 3-4 are cross-sectional views of the HV MOS transistor device take along A-A' and B-B' of FIG. 2, respectively.
Figure 4:
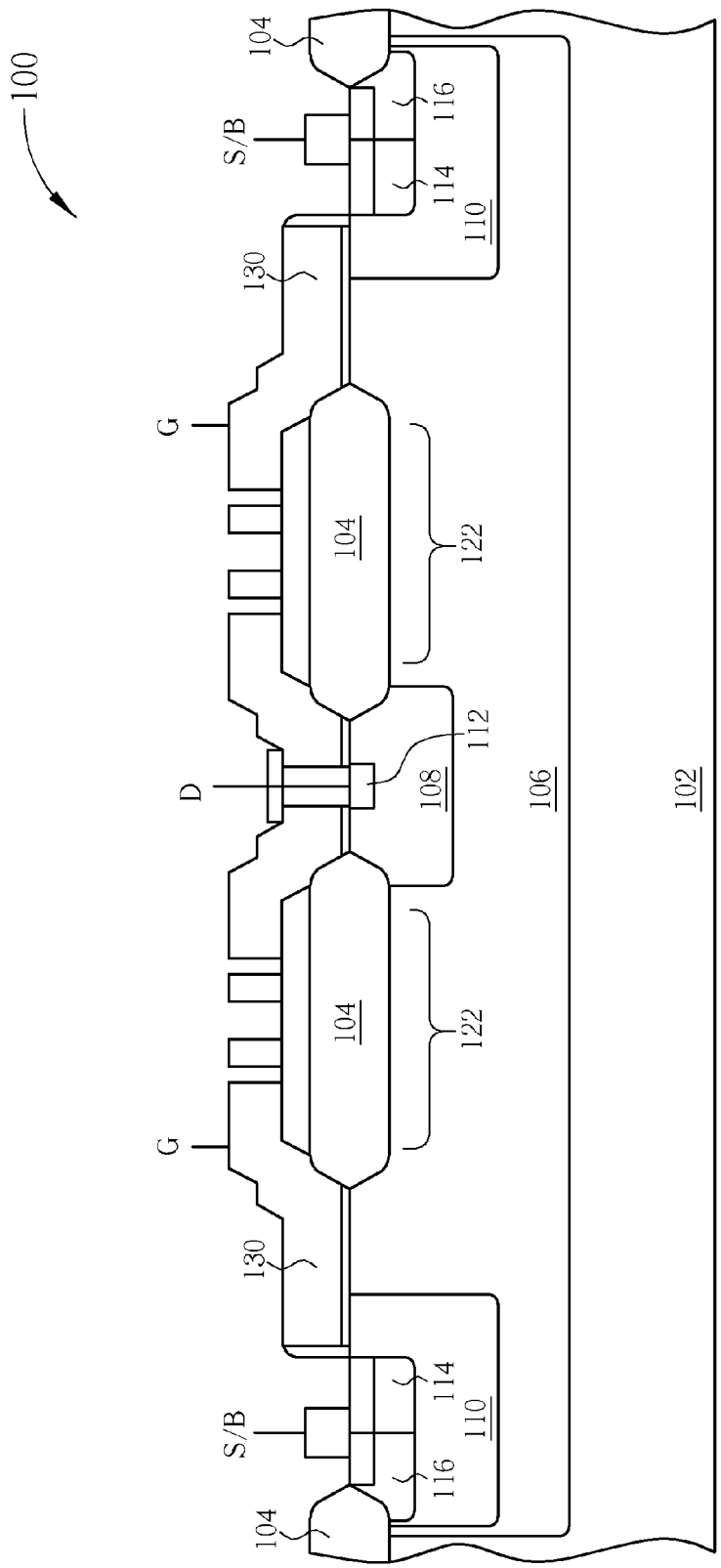

Please refer to FIGS. 2-6, FIG. 2 is a schematic drawing of a layout pattern of a HV MOS transistor device provided by a preferred embodiment of the present invention, and FIGS. 3-4 are cross-sectional views of the HV MOS transistor device take along A-A' and B-B' of FIG. 2, respectively. As shown in FIGS. 2-4, a HV MOS transistor device 100 provided by the preferred embodiment is positioned in a substrate 102, such as a silicon substrate. The substrate 102 includes a first conductivity type. In the preferred embodiment, the first conductivity type is p-type. The HV MOS transistor device 100 further includes an insulating layer 104. It is noteworthy that for clarifying spatial relationships between certain specific doped regions of the HV MOS transistor device 100, the insulating layer 104 is omitted from FIG. 2.

Please refer to FIGS. 2-6 again. The HV MOS transistor device 100 provided by the preferred embodiment further includes a deep well 106 having a second conductivity type. The second conductivity type and the first conductivity type are complementary to each other. Accordingly, the second conductivity type is n-type in the preferred embodiment. A drift region 108 and a high-voltage well region 110 (both shown in FIGS. 3-4) are formed in the deep well 160. The drift region 108 includes the second conductivity type while the high-voltage well region 110 includes the first conductivity type. In other words, the HV MOS transistor device 100 includes an n-type drift region 108 and a p-type high-voltage well region 110. A first doped region 112 is formed in the n-type drift region 108 while a second doped region 114 and a third doped region 116 are formed in the high-voltage well region 110. The first doped region 112 and the second doped region 114 include the second conductivity type and respectively serve as an n-type drain region 112 and an n-type source region 114 of the HV MOS transistor device 100. The third doped region 116 includes the first conductivity type and serves as a p-type body region 116 of the HV MOS transistor device 100. In addition, the body region 116 and the source region 114 are electrically connected as shown in FIGS. 2-4.

The HV MOS transistor device 100 also includes a gate 130. However, the gate 130 is omitted from FIG. 2 in order to clarify spatial relationships between certain specific doped regions of the HV MOS transistor device 100. As shown in FIG. 3 and FIG. 4, the gate 130 is positioned on the substrate 102 and covers a portion of the insulating layer 104.

Please still refer to FIGS. 2-4. The HV MOS transistor device 100 provided by the preferred embodiment further includes a non-continuous doped region 120. The non-continuous doped region 120 includes the first conductivity type and serves as a p-top region. As shown in FIGS. 2-4, the p-type non-continuous doped region 120 is positioned in between the n-drain region 112 and the n-source region 114. The drain region 112, the source region 114, and the non-continuous doped region 120 formed in the deep well 106 are not only spaced apart from each other, but also electrically isolated from each other by the deep well 106. As shown in FIG. 2 and FIG. 4, the non-continuous doped region 120 includes a plurality of gaps 122 formed therein. The gaps 122 interrupt the p-type doped portions and thus to form the p-type non-continuous doped region 120. A width of the gap 122 is smaller than or equal to 9 micrometers (μm). Furthermore, the insulating layer 104 covers the non-continuous doped region 120 and its gaps 122 entirely.

Please refer to FIG. 2 again. According to the preferred embodiment, the p-type non-continuous doped region 120 being formed under the insulating layer 104 and complementary to the n-source region 114 and the n-drain region 112 increases the resistance of the HV MOS transistor device 100. When high voltage signal (HV signal) passes through the p-type non-continuous doped region 120, the voltage step-down ability of the HV MOS transistor device 100 is consequently improved and the acceptable lower voltage signal is obtained. In other words, by providing the p-type non-continuous doped region 120, the breakdown voltage of the HV MOS transistor device 100 is efficaciously increased.

However, it is well known that $R_{ON}$ is always undesirably increased in accompaniment of the increased breakdown voltage. Therefore the preferred embodiment provides the gaps interrupting in the p-type doped portions, and thus to form the p-type non-continuous doped region 120. The gaps 122 are provided to lower the total area of doped area of the p-type non-continuous doped region 120 and to serve as an easy pathway for the electrons, therefore $R_{ON}$ is efficaciously reduced. It is noteworthy that because high breakdown voltage and low $R_{on}$ are conflicting parameters with a trade-off relationship, a ratio between a total area of the gaps 122 and a total area of the non-continuous doped region 120 is to be smaller than or equal to 20% according to the preferred embodiment, thus $R_{ON}$ can be reduced while the expectation of high breakdown voltage is still met.

Figure 5:
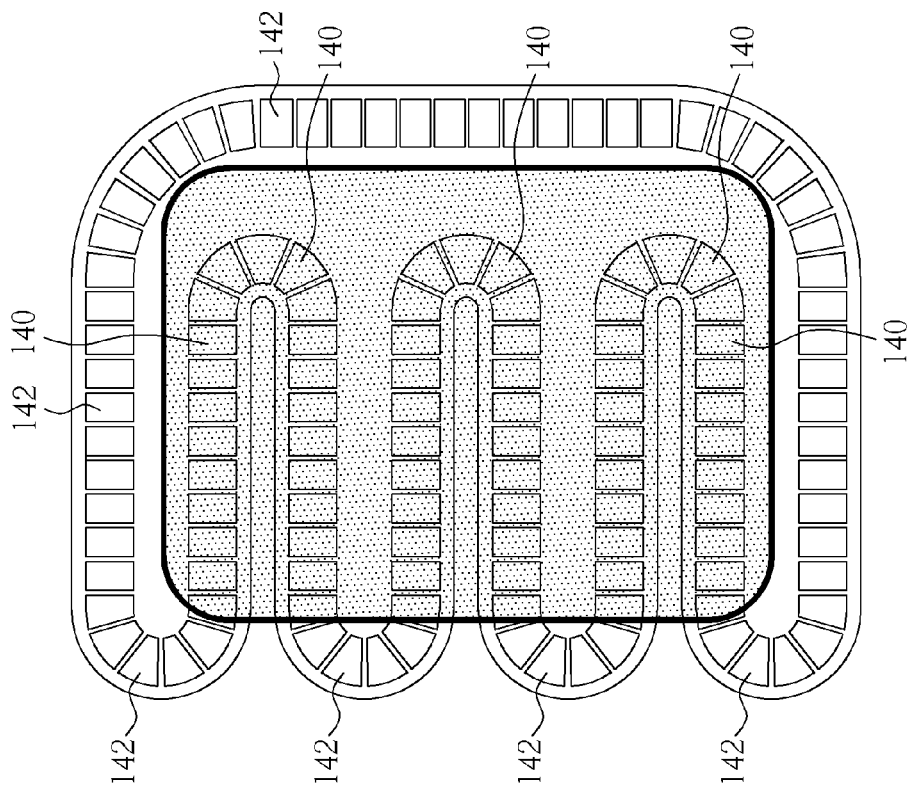

Please refer to FIG. 5. It is noteworthy that only the non-continuous doped region 120 and its gaps 122 are shown in FIG. 5 in order to clarify the spatial relationship of the non-continuous doped region 120 and its gaps 122 in the layout pattern of the non-continuous doped region 120 while other elements are omitted. However, those skilled in the art would easily realize the relationships of those omitted elements according to the aforementioned descriptions and FIGS. 2-4. As shown in FIG. 5, the non-continuous doped region 120 includes an inner portion and an outer portion 142 defined therein according to the preferred embodiment. In detail, the non-continuous doped region 120 extends along the brim of the deep well 106 and has a racetrack or a comb shape. Also, the gaps 122 in the non-continuous doped region 120 are arranged to have a racetrack or a comb shape, accordingly. As shown in FIG. 5, a base, two outmost teeth of the comb, and proximal ends of each teeth of the comb are defined as the outer portion 142 while the inner teeth, and bases of each tooth are defined as the inner portion 140. It is noteworthy that the gaps 122 positioned in the inner portion 140 include a first pattern density $D_1$, the gaps 122 positioned in the outer portion 142 include a second pattern density $D_2$, and the first pattern density $D_1$ is smaller than the second pattern density $D_2$. For example, a ratio $R_1$ of the total area of the gaps 122 positioned in the inner portion 140 and the total area of the non-continuous doped region 120 is smaller than or equal to 15%, while a ratio $R_2$ of the total area of the gaps 122 positioned in the outer portion 142 and the total area of the non-continuous doped region 120 is smaller than or equal to 25%. Furthermore, the difference between the ratio $R_1$ and the ratio $R_2$ is, for example but not limited to, 7%. Because the dopant concentration in the n-type deep well 106 corresponding to the outer portion 142 (that is the brim of the deep well 106) is inherently lower than the dopant concentration in the n-type deep well 106 corresponding to inner portion 140 due to the nature of ion implantation process, the HV MOS transistor device 100 suffers higher $R_{ON}$ corresponding to the outer portion 142. Therefore the gaps 122 arranged in the outer portion 142 are provided to have the higher second pattern density $D_2$ according to the preferred embodiment. Since the total area of the gaps 122 arranged in the outer portion 142 is greater, $R_{ON}$ of the HV MOS transistor device 100 corresponding to the outer portion 142 is reduced without lowering the breakdown voltage.

Figure 6:
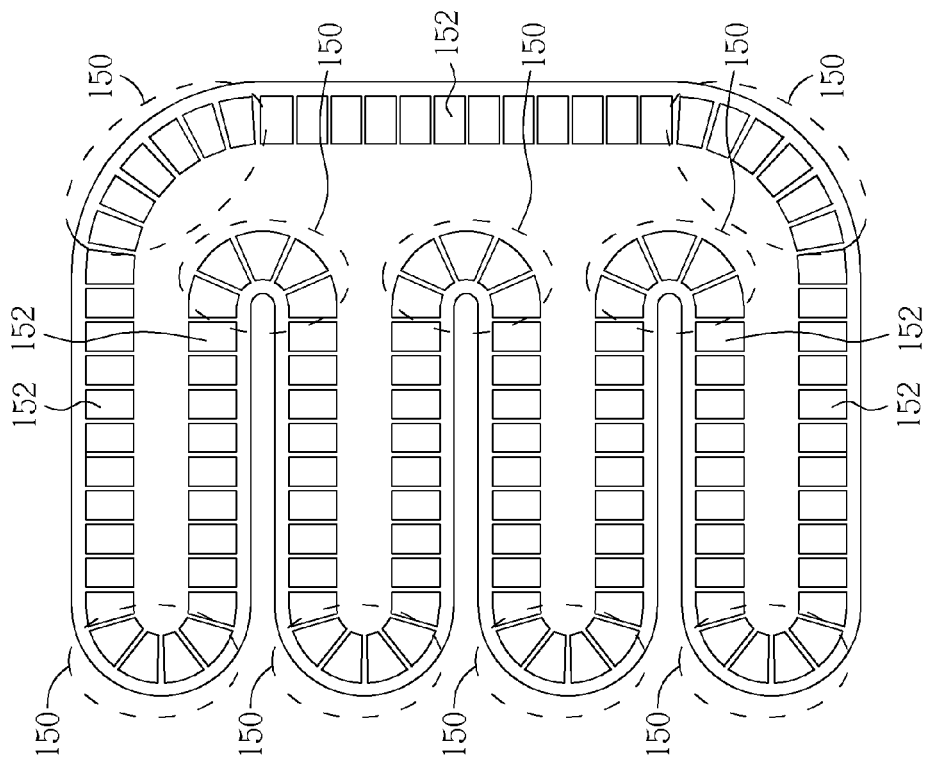

Please refer to FIG. 6. As mentioned above, only the non-continuous doped region 120 and its gaps 122 are shown in FIG. 6 in order to clarify the spatial relationship of the non-continuous doped region 120 and its gaps 122 in the layout pattern of the non-continuous doped region 120 while other elements are omitted. However, those skilled in the art would easily realize the relationships of those omitted elements according to the aforementioned descriptions and FIGS. 2-4. As shown in FIG. 6, the non-continuous doped region 120 includes a plurality of corner areas 150 and a plurality of straight-line areas 152 according to the preferred embodiment. As mentioned above, the non-continuous doped region 120 extends along the brim of the deep well 106 and has a comb shape. Accordingly, portions of the non-continuous doped region 120 having an arc profile are defined as the corner area 150 while portions of the non-continuous doped region 120 having the straight-line profile are defined as the straight-line areas 152. It is noteworthy that the gaps 122 positioned in the corner areas 150 include a third pattern density $D_3$, the gaps 122 positioned in the straight-line areas 152 includes a fourth pattern density $D_4$, and the third pattern density $D_3$ is larger than the fourth pattern density $D_4$. Because the electrical field corresponding to the corner areas 150 is always larger than the electrical field corresponding to the straight-line portions 152, the HV MOS transistor device 100 suffers higher $R_{ON}$ corresponding to the corner areas 150. Therefore the gaps 122 arranged in the corner areas 150 are provided to have the higher third pattern density $D_3$ according to the preferred embodiment. Since the total area of the gaps 122 arranged in the corner areas 150 is greater, $R_{ON}$ of the HV MOS transistor device 100 corresponding to the corner areas 150 is reduced without lowering the breakdown voltage.

According to the HV MOS transistor device and its layout pattern provided by the present invention, the non-continuous doped region is rendered to improve the breakdown voltage of the HV MOS transistor device. Furthermore, since the non-continuous doped region is interrupted by the gaps, the total area of doped portions of the non-continuous doped region is reduced. Consequently, $R_{ON}$ is decreased efficaciously. Furthermore, the present invention further balances $R_{ON}$ of the HV MOS transistor device without influencing the breakdown voltage by providing gaps having different pattern densities and sizes depending on dopant concentrations and electrical fields. Briefly speaking, the HV MOS transistor and the layout pattern thereof provided by the present invention realize the expectation of high breakdown voltage and low $R_{ON}$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of an implant layer comprising:
   at least a linear region comprising a plurality of first patterns to accommodate first dopants;
   at least a non-linear region comprising a plurality of second patterns to accommodate the first dopants; and
   a plurality of gaps respectively formed in between each first pattern and its adjacent first pattern, and all of the gaps comprising a same width,
   wherein the linear region abuts the non-linear region; and a pattern density of the first patterns in the linear region is smaller than a pattern density of the second patterns in the non-linear region.

2. The layout pattern of the implant layer according to claim 1, further comprising a source region of a metal-oxide-semiconductor (MOS) transistor device and a drain region of the MOS transistor device, and the source region and the drain region are formed at respective two sides of the linear region.

3. The layout pattern of the implant layer according to claim 2, wherein the source region and the drain region comprise second dopants.

4. The layout pattern of the implant layer according to claim 3, wherein the first dopants comprise a first conductivity type and the second dopants comprise a second conductivity type, and the first conductivity type and the second conductivity type are complementary.

5. The layout pattern of the implant layer according to claim 1, wherein the linear region and the non-linear region form a closed pattern.

6. The layout pattern of the implant layer according to claim 1, wherein the width of the gaps is smaller than or equal to 9 micrometers (μm).

7. The layout pattern of the implant layer according to claim 1, wherein a ratio between a total area of the gaps and a total area of the first patterns and the second patterns is smaller than or equal to 20%.

8. The layout pattern of the implant layer according to claim 1, wherein the linear region and the non-linear region are alternately arranged.

9. The layout pattern of the implant layer according to claim 1, wherein an amount of the first patterns is larger than an amount of the second patterns.

* * * * *